US007453699B2

(12) United States Patent
Inagawa et al.

(10) Patent No.: US 7,453,699 B2
(45) Date of Patent: Nov. 18, 2008

(54) DIGITAL ELECTRONIC APPARATUS WITH SUPPRESSED RADIANT NOISE

(75) Inventors: Hideho Inagawa, Yokohama (JP); Hiroyuki Yamaguchi, Kawasaki (JP); Shin'ichi Nishimura, Yokohama (JP); Daishiro Sekijima, Tokyo (JP); Tsunao Hombo, Tokyo (JP); Masafumi Kamei, Kashiwa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/624,825

(22) Filed: Jan. 19, 2007

(65) Prior Publication Data

US 2007/0117427 A1 May 24, 2007

Related U.S. Application Data

(62) Division of application No. 11/019,291, filed on Dec. 23, 2004, now Pat. No. 7,189,923.

(30) Foreign Application Priority Data

Dec. 25, 2003 (JP) ............................ 2003-430424
Nov. 10, 2004 (JP) ............................ 2004-326586

(51) Int. Cl.
*H05K 5/00* (2006.01)

(52) U.S. Cl. ...................... 361/733; 361/730; 361/803; 174/376

(58) Field of Classification Search ................ 174/350, 174/377, 376; 361/816, 818, 730, 733, 803; 355/97; 358/1.15
See application file for complete search history.

(56) References Cited

U.S. PATENT DOCUMENTS

| | | | | |
|---|---|---|---|---|
| 4,734,786 | A * | 3/1988 | Minakawa et al. | 358/451 |
| 5,770,898 | A * | 6/1998 | Hannigan et al. | 307/147 |
| 5,801,328 | A | 9/1998 | Rohde et al. | 174/359 |
| 6,172,881 | B1 | 1/2001 | Hirai | 361/816 |
| 2001/0021979 | A1 | 9/2001 | Ito | 713/189 |
| 2001/0035973 | A1* | 11/2001 | Kusumoto | 358/1.14 |
| 2003/0102618 | A1* | 6/2003 | Sesek | 270/58.08 |
| 2004/0238199 | A1 | 12/2004 | Yamanaka et al. | 174/68.1 |
| 2004/0263891 | A1 | 12/2004 | Yamada et al. | 358/1.13 |

FOREIGN PATENT DOCUMENTS

| | | |
|---|---|---|
| JP | 5-159835 | 6/1993 |
| JP | 8-106819 | 4/1996 |
| JP | 10-208791 | 8/1998 |

* cited by examiner

*Primary Examiner*—Hung V Ngo
(74) *Attorney, Agent, or Firm*—Fitzpatrick, Cella, Harper & Scinto

(57) ABSTRACT

A digital electronic apparatus includes a plurality of units and a cable. The plurality of units have metallic housings and are combined such that surfaces of the metallic housings are opposed to each other. The cable is laid on a surface of the metallic housing of at least one of the units. The surface on which the cable is laid is other than the surfaces of the metallic housings that are opposed to each other.

1 Claim, 10 Drawing Sheets

DIGITAL ELECTRONIC APPARATUS WITH SUPPRESSED RADIANT NOISE

This application is a divisional of application Ser. No. 11/019,291, filed Dec. 23, 2004 now U.S. Pat. No. 7,189,923.

BACKGROUND OF THE INVENTION

1. Field of the Invention

The present invention relates to a layout of a cable for transmitting a high-speed digital signal for a relevant unit in a digital electronic apparatus, such as a copying machine, with respect to a metal housing of the unit. More particularly, the present invention relates to a technique for suppressing radiant noises in the electronic apparatus.

2. Description of the Related Art

Hitherto, a digital electronic apparatus, for example a digital copying machine, has been designed such that an image read section for reading an image and an image printing section for printing the image are disposed in one metallic housing. To accommodate varying specification demands of customers, however, it is desirable to be capable of changing the specifications of such an apparatus. Accordingly, an electronic apparatus of the separated-type, in combination with various functional units, has become prevalent. Specifically, in this type of apparatus, the image read section and the image printing section are constructed as separate units, i.e., a reader unit and a printer unit, which are accommodated in separate metallic housings. Also, a paper supply section for supplying paper on which an image is to be printed, a paper eject section for ejecting paper on which an image has been printed, and the like, are increasingly constructed as separate operating units. As a result of the various functional sections being split into separate units, metallic housings of the different units are commonly arranged opposite to each other.

In the separated-type digital electronic apparatus described above, at least one of the various units has a cable for transmitting a high-speed digital signal, such as a clock signal. Such a cable may be disposed externally of the housing of the unit, depending on an arrangement space and the order of unit assembly. However, when the high-speed digital signal is transmitted through a gap between opposing metallic housings, those housings become electrically coupled, whereby a parallel plate resonance occurs and radiant noises at a very high level generate at a particular frequency. Particularly, this problem is more noticeable in the case of a cable for transmitting a radio frequency signal of not lower than 100 KHz or, in the case of a cable connected to a controller board on which a controller operates, at a frequency of not lower than 10 MHz. The parallel plate resonance will be described in more detail below.

FIG. 13 is a perspective view showing a configuration of a known digital copying machine. Assuming the side where a console unit 14 manipulated by a user is arranged to be the front side, FIG. 13 is an oblique view from behind the digital copying machine. For convenience in explanation, FIG. 13 uses dashed lines to create a see-through view.

The digital copying machine comprises a reader unit 11 for reading an image, a printer unit 12 for printing the image, a paper supply unit 16 for supplying paper to the printer unit 12, an optional paper supply unit 17 that is optionally mountable, a finisher unit 18 for ejecting the paper on which the image has been printed, and a feeder unit 19 arranged above the reader unit 11 and feeding a manually set original document. An image controller unit 13 for executing image processing is mounted on the rear side (front side as viewed in FIG. 13) of the printer unit 12, and has ports for establishing network connections to external devices and for interfacing with optional units. The console unit 14 is mounted on the front side (rear side as viewed in FIG. 13) of the printer unit 12. The console unit 14 displays the operation status of the copying machine, and allows a user to operate the copying machine. The image controller unit 13 and the console unit 14 are connected to each other by a digital signal cable 15 through which a digital signal is transmitted. As illustrated, the digital signal cable 15 is laid on an upper surface of a metallic housing of the printer unit 12, and the reader unit 11 is arranged above the printer unit 12 with a predetermined gap left therebetween.

FIG. 14 is a schematic view showing a layout of the digital signal cable 15 and respective metallic housings of the reader unit 11, the printer unit 12 and the finisher unit 18 shown in FIG. 13. The digital signal cable 15 is disposed in a space defined between the upper surface of the metallic housing of the printer unit 12 and a lower surface of the metallic housing of the reader unit 11. Therefore, parallel plate resonance occurs between the upper surface of the metallic housing of the printer unit 12 and the lower surface of the metallic housing of the reader unit 11, and radiant noises at a very high level are generated at a particular frequency.

However, the mechanism of the radiant noises, which are generated due to the layout of the metallic housings and the cable and the influence of electrical coupling between the adjacent metallic housings, is very difficult and very complicated to make clear the phenomenon. Accordingly, the mechanism of the radiant noises is not yet fully clarified up to now, and it has been difficult to consider that point in the stage of apparatus design.

To suppress the radiant noises generated due to the layout of the metallic housing and the cable and the influence of electrical coupling between the metallic housings, Japanese Patent Laid-Open No. 05-159835 discloses a method of fitting a ferrite core over the cable, i.e., a noise source, so that noise components will not propagate from the cable. Also, Japanese Patent Laid-Open No. 08-106819 discloses a method of using a shielded cable prepared by covering the cable with a shield material in advance. Further, Japanese Patent Laid-Open No. 10-208791 discloses a method of interconnecting the metallic housings of the adjacent units at several points by using metallic members adapted for electrical connection, thereby stabilizing the ground potential between the adjacent units to suppress the radiant noises.

However, those known methods have problems as follows. The method of fitting the ferrite core, disclosed in the above-cited Japanese Patent Laid-Open No. 05-159835, is practiced as a countermeasure taken after manufacturing the product. This results in a serious problem from the viewpoint of productivity in that the number of manufacturing steps increases and there is no space for arranging the ferrite core. Further, because the ferrite core is expensive, it is impractical to use many ferrite cores. In addition, the ferrite core is effective for only signals in the frequency band of 30 to 500 Hz, but it is not effective for the radiant noises at frequencies higher than that band.

The method of using the shielded cable, disclosed in the above-cited Japanese Patent Laid-Open No. 08-106819, increases the total cost of the apparatus because the shielded cable is very expensive.

The method of interconnecting the metallic housings of the adjacent units at several points by using metallic members adapted for electrical connection, as disclosed in the above-cited Japanese Patent Laid-Open No. 10-208791, is not effective unless the metallic housings are interconnected at portions corresponding to the nodes in phase of a flowing current.

Then, from the practical point of view, it is very difficult to interconnect the metallic housings exactly in the portions corresponding to the nodes in phase of the current. Even if such interconnection is performed, this method merely shifts the resonance frequency. In other words, the radiant noises may occur in another frequency band, and a complete solution is not obtained.

SUMMARY OF THE INVENTION

It is an object of the present invention to, in a separated-type digital electronic apparatus comprising a plurality of functional units, e.g., a digital copying machine, improve a layout of electrically-coupled opposing surfaces of metallic housings of adjacent units and a cable that transmits high speed digital signal and that is laid along the metallic housings, thereby suppressing radiant noises generated due to a parallel plate resonance phenomenon between the opposing metallic housings, without adding any anti-noise members, requiring complicated work, or increasing the manufacturing cost.

To achieve the above object, the present invention provides a digital electronic apparatus including a plurality of units having metallic housings, and a cable laid on a surface of the metallic housing of at least one of the units. The plurality of units are combined such that surfaces of the housings are opposed to each other. The surface of the metallic housing on which the cable is laid is other than the surfaces of the metallic housings that are opposed to each other.

In another aspect of the digital electronic apparatus of the present invention, the not-opposed surface on which the cable is laid is positioned angularly away at 180° or more from the surface of the metallic housing of any unit different from the at least one unit.

In a further aspect of the digital electronic apparatus of the present invention, the not-opposed surface on which the cable is laid is the rear side of a surface of the metallic housing of the at least one unit, which is positioned opposite to the metallic housing of any other unit.

In a still further aspect of the digital electronic apparatus of the present invention, the plurality of units include at least two among an image reading unit, an image printing unit, and a console unit.

In yet another aspect of the digital electronic apparatus of the present invention, the cable transmits a high-speed signal of 100 KHz or higher, or the cable is connected to a controller board operating at a frequency of 10 MHz or higher.

With the cable layout according to the present invention, the parallel plate resonance phenomenon resulting from the electrical coupling between opposing metallic housing surfaces of functional units can easily be avoided without adding any expensive anti-noise members, such as a ferrite core and a cable shielding material, and without performing complicated processes. As a result, it is possible to greatly suppress radiant noises generated in a separated-type digital electronic apparatus having a plurality of functional units, e.g., a digital copying machine.

Further objects, features and advantages of the present invention will become apparent from the following description of the preferred embodiments with reference to the attached drawings.

DESCRIPTION OF THE PREFERRED EMBODIMENTS

Embodiments of the present invention will be described below.

With reference to FIGS. 1A, 1B-1, 1B-2, 1C, 1D and 2A-2C, a description is first made of a parallel plate resonance phenomenon that occurs in a separated-type digital electronic apparatus and a layout (positional relationship) of two metallic housings and a digital signal cable.

Figure 1A:
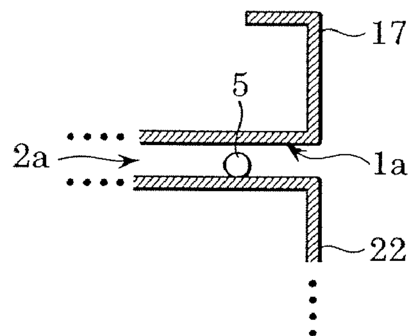
FIGS. 1A, 1B-1, 1B-2, 1C and 1D are schematic views showing layouts of two metallic housings and a digital signal cable to explain a parallel plate resonance phenomenon.
Figure 2A:
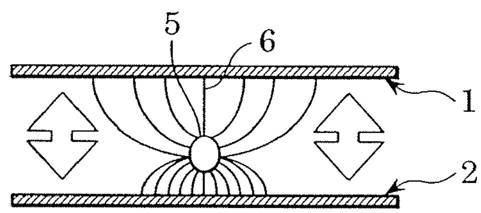
FIGS. 2A, 2B and 2C are schematic views showing behaviors of lines of electric forces generated by the digital signal cable, to explain the parallel plate resonance phenomenon.

In FIG. 1A, a lower surface 1*a* of a first metallic housing 1 and an upper surface 2*a* of a second metallic housing 2 are arranged opposite to each other. A digital signal cable 5 is laid between the surfaces 1*a*, 2*a*. Behaviors of lines of electric forces 6 generated from the digital signal cable 5 toward the lower surface 1*a* of the first metallic housing 1 and the upper surface 2*a* of the second metallic housing 2 are illustrated in FIG. 2A. Although the digital signal cable 5 is laid on the upper surface 2*a* of the second metallic housing 2, a space is left between the digital signal cable 5 and the upper surface 2*a* of the second metallic housing 2 in FIG. 2A because the digital signal cable 5 has an insulating outer sheath.

As seen from FIG. 2A, the lines of electric forces 6 are generated at different densities between the digital signal cable 5 and the lower surface 1*a* of the first metallic housing 1 and the digital signal cable 5 and the upper surface 2*a* of the second metallic housing 2. When the spacing between the lower surface 1*a* of the first metallic housing 1 and the upper surface 2*a* of the second metallic housing 2 is narrow in such an unbalanced state, electrical coupling between the surfaces la, 2a becomes very strong. Accordingly, lines of electric forces having a higher density are generated, and a parallel plate resonance phenomenon occurs with the lines of electric forces 6 serving as excitation sources. If the parallel plate resonance phenomenon occurs, the above-described structure functions as a highly efficient radiant antenna and strong radiant noises are generated.

Figure 1C:
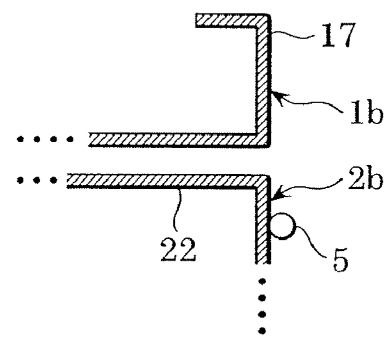
Figures 1, 1B:
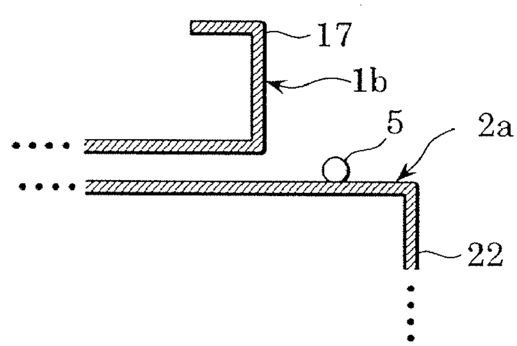
Figure 2B:
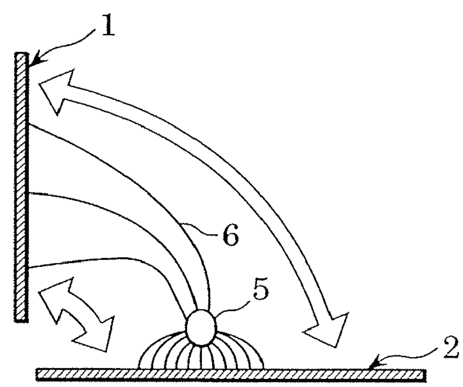

In FIG. 1B-1, the digital signal cable 5 is laid on the upper surface 2*a* of the second metallic housing 2. The first metallic housing 1 is arranged offset horizontally leftward from the position shown in FIG. 1A, and an outer surface 1*b* of a side plate of the first metallic housing 1 is arranged to cross the upper surface 2*a* of the second metallic housing 2 at 90°. In other words, the first metallic housing 1 is not disposed above the digital signal cable 5. FIG. 2B shows behaviors of lines of electric forces 6 generated from the digital signal cable 5 toward the outer surface 1*b* of the side plate of the first metallic housing 1 and the upper surface 2*a* of the second metallic housing 2 in the arrangement of FIG. 1B-1. In FIG. 2B, as in FIG. 2A, a predetermined space is left between the digital signal cable 5 and the upper surface 2*a* of the second metallic housing 2, due to the digital signal cable's 5 outer sheath.

As seen from FIG. 2B, the lines of electric forces 6 are generated at different densities between the digital signal cable 5 and the outer surface 1*b* of the side plate of the first metallic housing 1 and the digital signal cable 5 and the upper surface 2*a* of the second metallic housing 2. Since the lines of electric forces 6 are generated toward the outer surface 1*b* of the side plate of the first metallic housing 1 and toward the upper surface 2*a* of the second metallic housing 2, electrical coupling similarly develops, between the outer surface 1*b* of the side plate of the first metallic housing 1 and the upper surface 2*a* of the second metallic housing 2, though at a lower level than that in FIG. 2A. Then, when the digital signal cable 5 and the outer surface 1*b* of the side plate of the first metallic housing 1 are positioned close to each other at a distance of about several centimeters, a resonance phenomenon similar to the parallel plate resonance phenomenon occurs with the lines of electric forces 6 serving as excitation sources. If the resonance phenomenon occurs, the above-described structure functions as a highly efficient radiant antenna and strong radiant noises are generated. In the layout of FIG. 1B-1, if the first metallic housing 1, and hence the outer surface 1*b* thereof, are not present aside the digital signal cable 5, the problem of the parallel plate resonance is not caused.

Figure 1D:
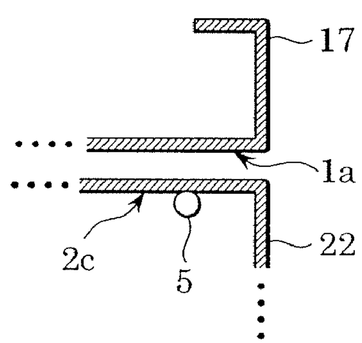
Figures 1, 1B, 2:
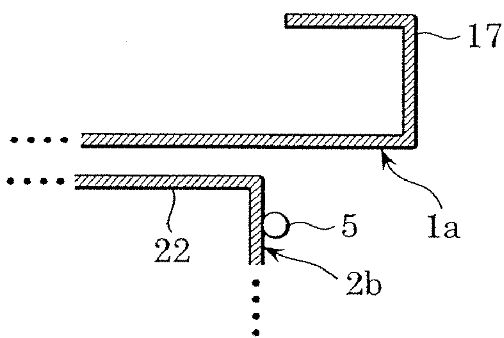

In FIG. 1B-2, the digital signal cable 5 is laid on an outer surface 2*b* of a side plate of the second metallic housing 2. The first metallic housing 1 is offset horizontally rightward from the position shown in FIG. 1A, such that the lower surface 1*a* of the first metallic housing 1 crosses the outer surface 2*b* of the side plate of the second metallic housing 2 at a 90° angle. In this case, lines of electric forces are generated from the digital signal cable 5 toward the lower surface 1*a* of the first metallic housing 1 and toward the outer surface 2*b* of the side plate of the second metallic housing 2 in a manner similar to that described with regard to FIGS. 1B-1 and 2B. Accordingly, as in the case of FIG. 2B, large radiant noises are generated. In the layout of FIG. 1B-2, however, if the first metallic housing 1, and hence the lower surface 1*a* thereof, are not present above the digital signal cable 5, the problem of the parallel plate resonance is not caused.

Figure 2C:
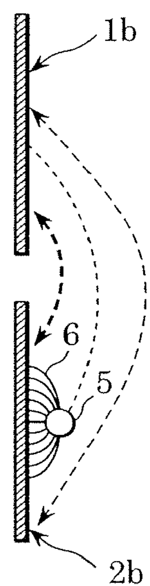

In FIG. 1C, the lower surface 1*a* of the first metallic housing 1 and the upper surface 2*a* of the second metallic housing 2 are arranged opposite to each other and the digital signal cable 5 is laid on the outer surface 2*b* of the side plate of the second metallic housing 2. In other words, the outer surface 1*b* of the side plate of the first metallic housing 1 and the outer surface 2*b* of the side plate of the second metallic housing 2 on which the digital signal cable 5 is laid are arranged angularly away from each other at an angle of 180° in the clockwise direction. FIG. 2C shows behaviors of lines of electric forces 6 generated from the digital signal cable 5 toward the outer surface 1*b* of the side plate of the first metallic housing 1 and toward the outer surface 2*b* of the side plate of the second metallic housing 2 in the arrangement of FIG. 1C. In FIG. 2C, as in FIG. 2A, a predetermined space is left between the digital signal cable 5 and the outer surface 2*b* of the side plate of the second metallic housing 2 due to the outer sheath of the digital signal cable 5. The lines of electric forces 6 are generated from the digital signal cable 5 such that the lines of electric forces 6 are concentrated near the outer surface 2*b* of the side plate of the second metallic housing 2, but are directed toward the outer surface 1*b* of the side plate of the first metallic housing 1 only in minimal amounts, it at all. Accordingly, electrical coupling between the outer surface 1*b* of the side plate of the first metallic housing 1 and the outer surface 2*b* of the side plate of the second metallic housing 2 is weak and the parallel plate resonance phenomenon hardly occurs. Hence, radiant noises are not generated.

In a radio frequency (RF) band of several MHz or higher where radiant noises become problematic, a current flowing in a surface of a metallic housing is concentrated in a portion of a conductor skin at a depth from several to several tens microns. It is therefore known that, in a single metallic member having a thickness of several hundreds microns or more, front and rear surfaces of the single metallic member should be handled as different surfaces. In FIG. 1D, the lower surface 1*a* of the first metallic housing 1 and the upper surface 2*a* of the second metallic housing 2 are arranged opposite to each other, and the digital signal cable 5 is laid on the underside 2*c* of the upper surface 2*a* of the second metallic housing 2. In this case, lines of electric forces generated from the digital signal cable 5 are directed from the digital signal cable 5 only toward the underside 2*c* of the upper surface 2*a* of the second metallic housing 2, and the lines of electric forces directed toward the lower surface 1*a* of the first metallic housing 1 and the upper surface 2*a* of the second metallic housing 2 are minimized. Accordingly, no resonance phenomenon occurs between the lower surface 1*a* of the first metallic housing 1 and the upper surface 2*a* of the second metallic housing 2, and radiant noises are not generated.

Herein, the term "opposing metallic housings" represent the relationship between coupling surfaces formed by respective masses of opposing members each of which has the same potential at any proximity point. Also, when those opposing surfaces are taken into consideration, it is premised that the opposing surfaces define exterior surfaces of respective units. As a matter of course, the present invention is further applicable with similar advantages regardless of whether the surface of each metallic housing has a completely flat plane or a plane including a dent or a bend.

The digital signal cable 5 serving as an excitation source includes not only a cable used for the console unit and having at least one core line through which a signal of 1 MHz or higher is transmitted, but also a serial signal cable for an option unit. In addition, the present invention is similarly applicable to, for example, a DC power supply cable that generates superimposed switching noises with a frequency of 100 KHz or higher, and a cable connected to a controller board containing a circuit system that operates at a frequency of 10 MHz or higher.

Embodiments of a cable layout in the digital electronic apparatus according to the present invention will now be described in detail with reference to the drawings.

First Embodiment

Figure 3:
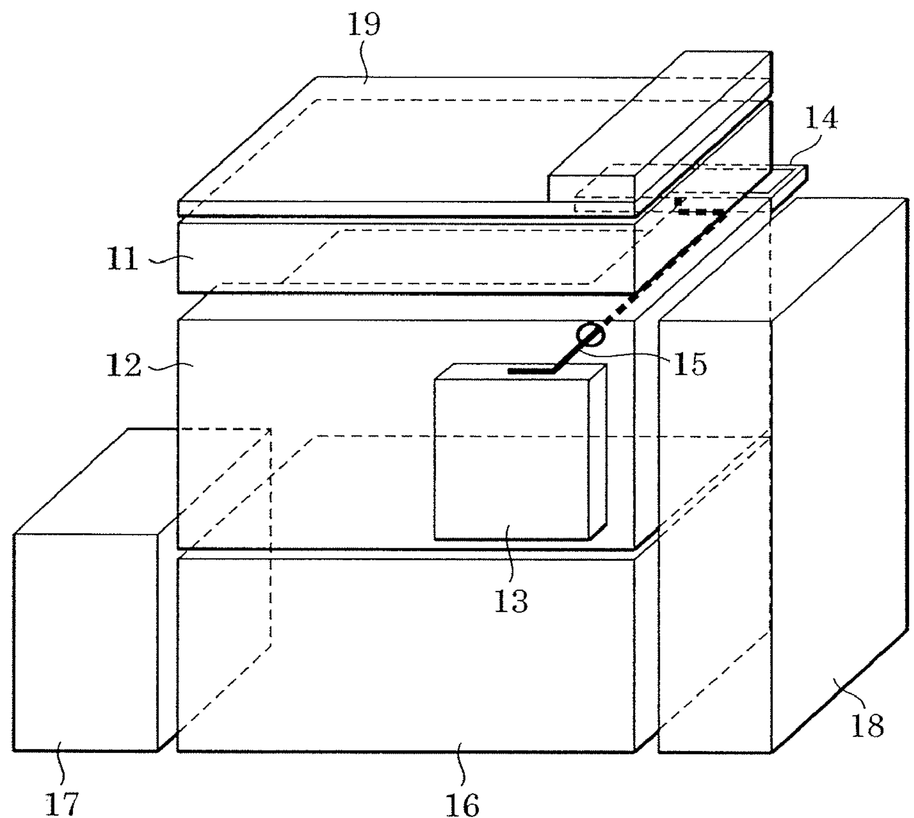
FIG. 3 is a perspective view of a digital copying machine according to a first embodiment.

FIG. 3 is a perspective view of a separated-type digital copying machine according to a first embodiment of the present invention. For illustrative purposes, the view is from behind the digital copying machine and dashed lines are used in FIG. 3 to create a see-through view. The digital copying machine comprises a reader unit 11 for reading an image, a printer unit 12 for printing the image, an image controller unit 13 mounted on the rear side of the printer unit 12, and a console unit 14 mounted on the front side of the printer unit 12. The image controller unit 13 establishes network connection to an external device and connection between the units, and executes image processing. The console unit 14 is manipulated by a user to operate the copying machine, and displays the operating status of the copying machine. A digital signal cable 15 for transmitting a signal is laid between the image controller unit 13 and the console unit 14 while penetrating a rear panel of the printer unit 12 and extending along the underside of an upper panel of the printer unit 12. A paper supply unit 16 for supplying paper to the printer unit 12 is arranged below the printer unit 12. The digital copying machine of FIG. 3 further includes an optional paper supply unit 17, a finisher unit 18 for ejecting paper onto which an image has been printed, and a feeder unit 19 arranged above the reader unit 11 and feeding a manually set original document.

Figure 4:
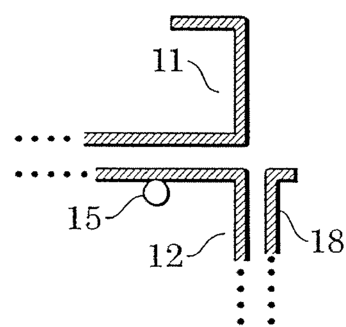
FIG. 4 is a schematic view showing a layout of metallic housings and a digital signal cable in the digital copying machine according to the first embodiment.

FIG. 4 is a schematic view showing, in an enlarged scale, a layout of components of the apparatus of FIG. 3. In particular, FIG. 4 shows that the layout of the reader unit 11, the printer unit 12, and the digital signal cable 15, according to this embodiment is the same as that shown in FIG. 2D. Accordingly, no resonance phenomenon occurs between the lower surface of the reader unit 11 and the upper surface of the printer unit 12, and radiant noises are not generated. As should also be understood, because of the layout of the printer unit 12, the finisher unit 18, and the digital signal cable 15, no resonance phenomenon occurs between the printer unit 12 and the other components, and radiant noises are not generated.

Second Embodiment

Figure 5:
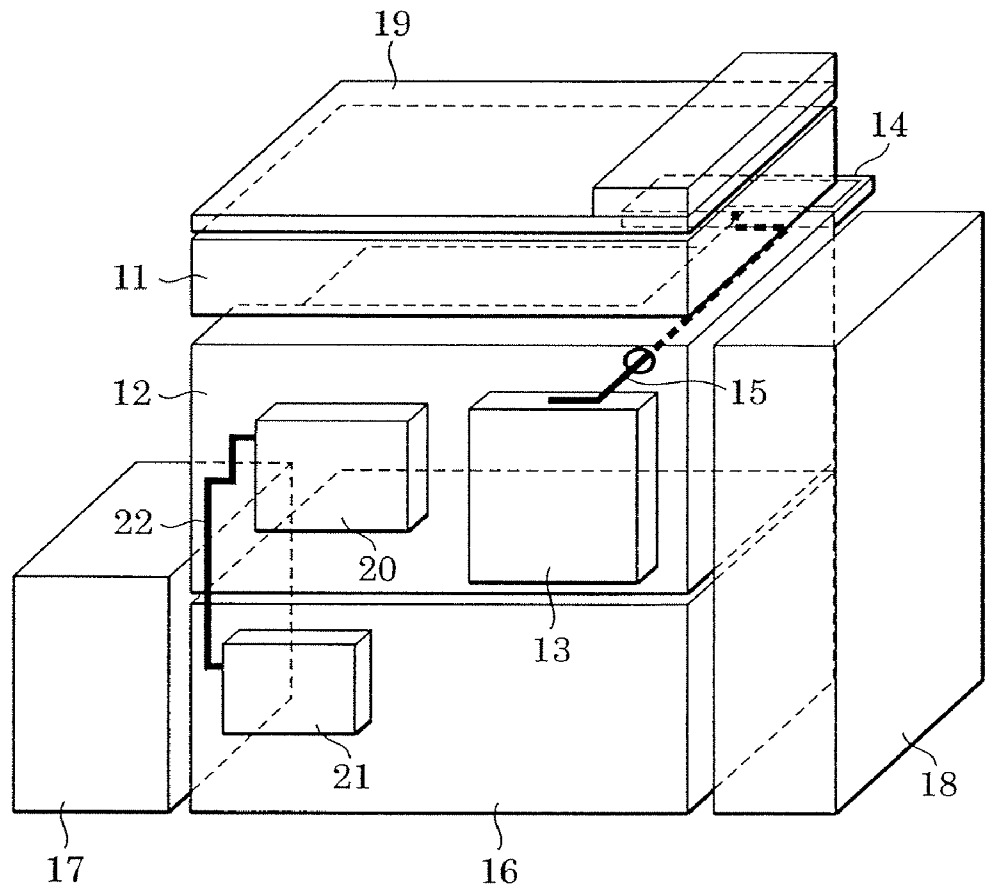
FIG. 5 is a perspective view of a digital copying machine according to a second embodiment.

FIG. 5 is a perspective view of a separated-type digital copying machine according to a second embodiment of the present invention, the view being from behind the digital copying machine. For convenience in explanation, FIG. 5 uses dashed lines to create a see-through view. The same components in FIG. 5 as those in FIG. 3 are denoted by the same symbols, and a description thereof is omitted here.

Referring to FIG. 5, an engine controller unit 20 is mounted to the printer unit 12 and controls the printing process executed by the printer unit 12. An option controller unit 21 is mounted to the paper supply unit 16 and controls the paper supply process executed by the paper supply unit 16. Further, a digital signal cable 22 connects the engine controller unit 20 and the option controller unit 21 to each other. As with the relationships among the digital signal cable 15 and nearby metallic housings, i.e., the printer unit 12, the reader unit 11 and the finisher unit 18, in the above first embodiment, the relationships among the digital signal cable 22 and nearby metallic housings, i.e., the printer unit 12, the paper supply unit 16 and the optional paper supply unit 17, should be taken into account in this second embodiment.

Figure 6:
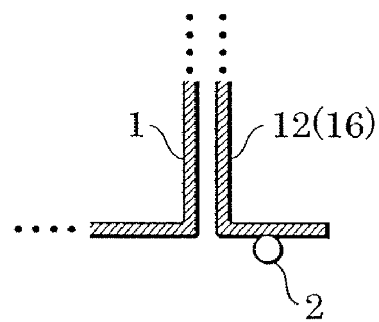
FIG. 6 is a schematic view showing a layout of metallic housings and a digital signal cable in the digital copying machine according to the second embodiment.

FIG. 6 is a schematic view showing, in an enlarged scale, the layout of components of the apparatus of FIG. 5. The layout of the printer unit 12, the optional paper supply unit 17, and the digital signal cable 22, shown in FIG. 5, corresponds generally to that shown in FIG. 2C. Therefore, no resonance phenomenon occurs between a side surface 12*a* of the printer unit 12 and a side surface 17*a* of the optional paper supply unit 17, and radiant noises are not generated. Similarly, the paper supply unit 16, the optional paper supply unit 17, and the digital signal cable 22 are arranged such that no resonance phenomenon occurs and radiant noises are not generated.

In addition to the embodiments described above, other exemplary sections of the digital copying machine, to which the present invention is applicable, include cable wiring between the printer unit and the finisher unit, cable wiring between the reader unit and the feeder unit, and the like.

Example 1

Figure 7:
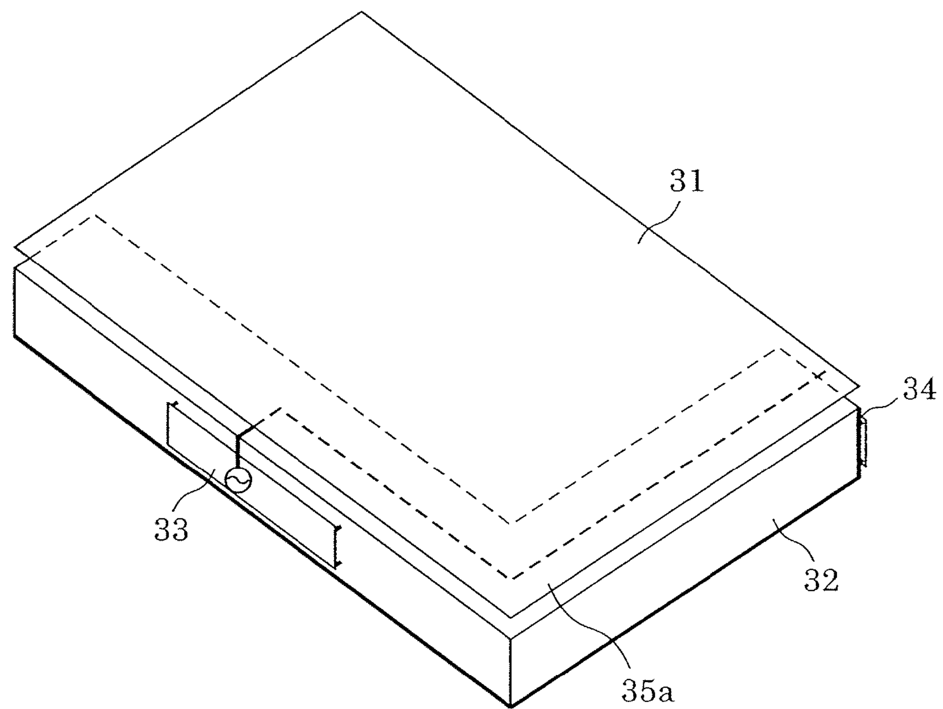
FIG. 7 is a perspective view of an electromagnetic field simulation model in the related art.
Figure 13:
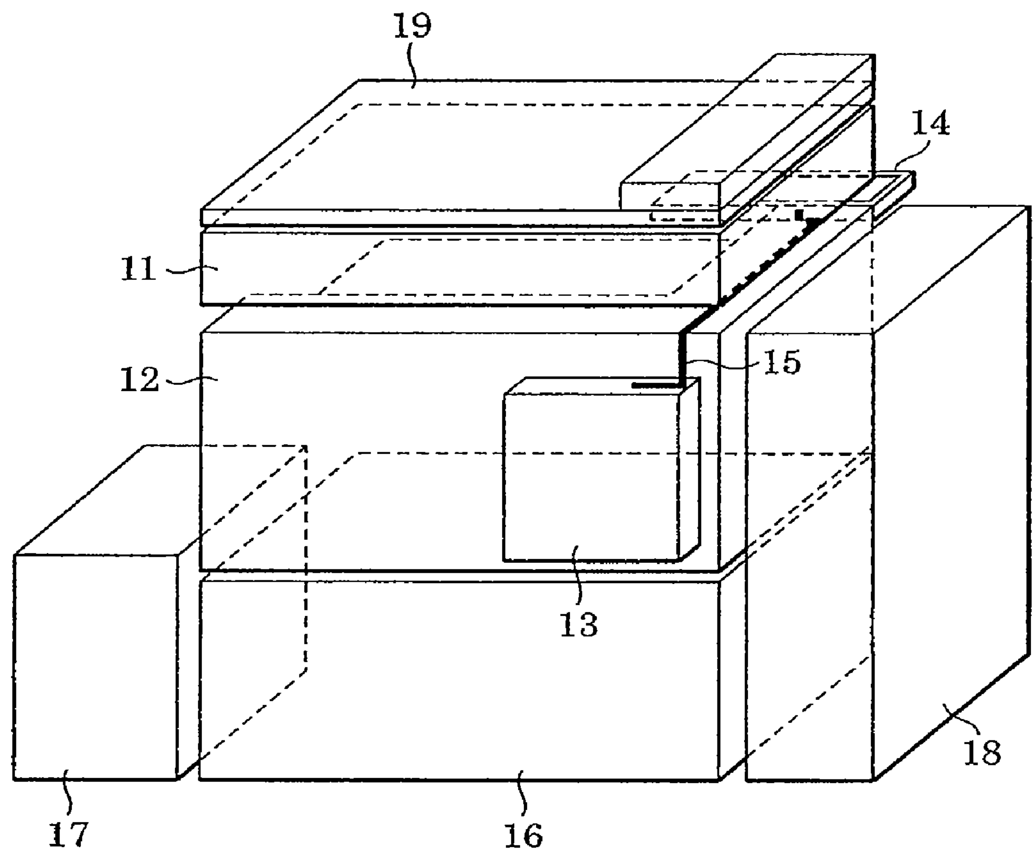
FIG. 13 is a perspective view of a known digital copying machine.
Figure 14:
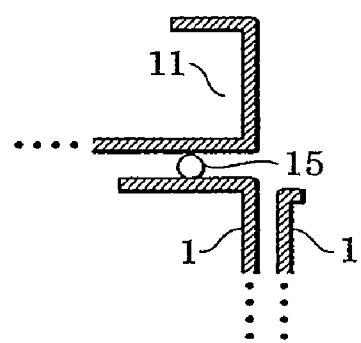
FIG. 14 is a schematic view showing a layout of metallic housings and a digital signal cable in the digital copying machine shown in FIG. 13.

In order to verify effectiveness of the cable layout according to the present invention, an analysis was conducted based on an electromagnetic field simulation model prepared by simulating the reader unit 11, the printer unit 12, and the digital signal cable 15. FIG. 7 shows the electromagnetic field simulation model for the cable layout, shown in FIGS. 13, 1A and 2A, according to the related art.

Referring to FIG. 7, the electromagnetic field simulation model includes a reader bottom panel model 31 with a length of 500 mm and a width of 800 mm corresponding to a bottom panel of the reader unit 11. The model also includes an L-shaped metallic housing model 32 with a length of 500 mm, a width of 800 mm and a height of 150 mm, corresponding to the printer unit 12. The L-shaped metallic housing model 32 is made of a metallic material. A board model 33 with a length of 100 mm, a width of 200 mm and a thickness of 1.6 mm corresponds to the image controller unit 13, and it is made of an insulating material, e.g., a vitreous epoxy material, having a specific inductive capacity of 4.3. The board model 33 is mounted to a side, e.g., a rear surface, of the L-shaped metallic housing model 32. Another board model 34 with a length of 80 mm, a width of 100 mm and a thickness of 1.6 mm is formed corresponding to the console unit 14 as an image target. It is also made of an insulating material, e.g., a vitreous epoxy material, having a specific inductive capacity of 4.3. The board model 34 is mounted to a side, e.g., a front surface, of the L-shaped metallic housing model 32, which is opposed to the side of the L-shaped metallic housing model 32 to which the board model 33 is mounted. A cable model 35*a* with a diameter of 1 mm corresponds to the digital signal cable 15 connecting the image controller unit 13 and the console unit 14 to each other, and it is wired to extend along an upper surface of the L-shaped metallic housing model 32. The cable model 35*a* is made of a metallic material.

Figure 8:
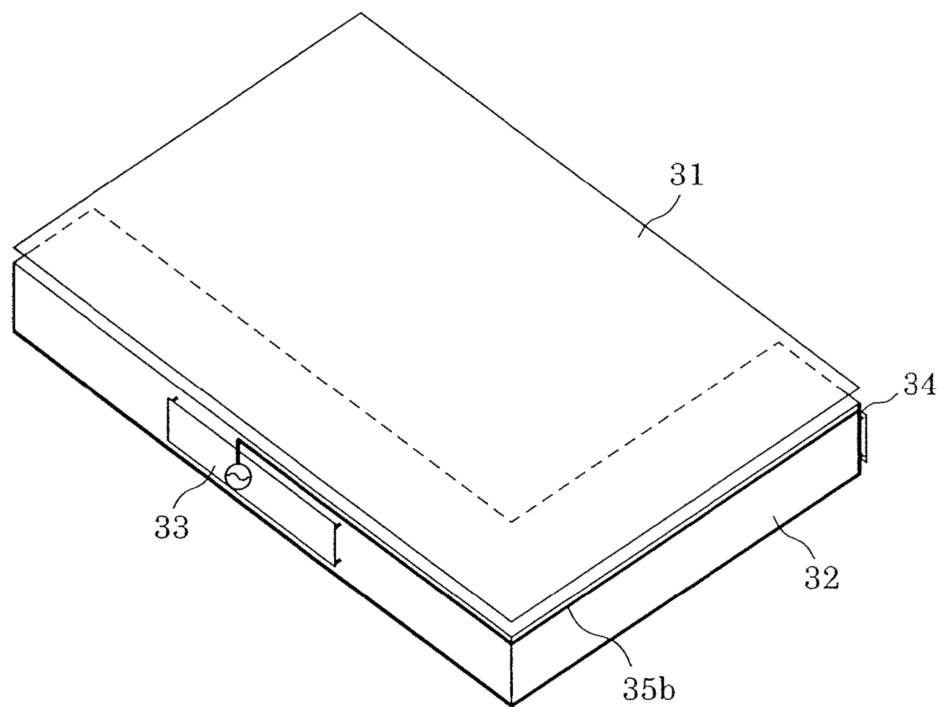
FIG. 8 is a perspective view of an electromagnetic field simulation model in the second embodiment.

On the other hand, FIG. 8 shows an electromagnetic field simulation model prepared using the relationships among the reader unit 11, the optional paper supply unit 17, and the digital signal cable 22 described above with respect to the second embodiment of the present invention. In particular, the relationships among the L-shaped metallic housing model 32, the reader bottom panel model 31, and the digital signal cable 35*b* simulate the components of the actual device. Note that the electromagnetic field simulation model shown in FIG. 8 corresponds to the cable layout shown in FIGS. 1C and 2C.

FIG. 8 differs from FIG. 7 only in placement of the cable model 35*a*, 35*b*. The cable model 35*b* in FIG. 8 is wired to extend along a side surface of the L-shaped metallic housing model 22.

Figure 9:
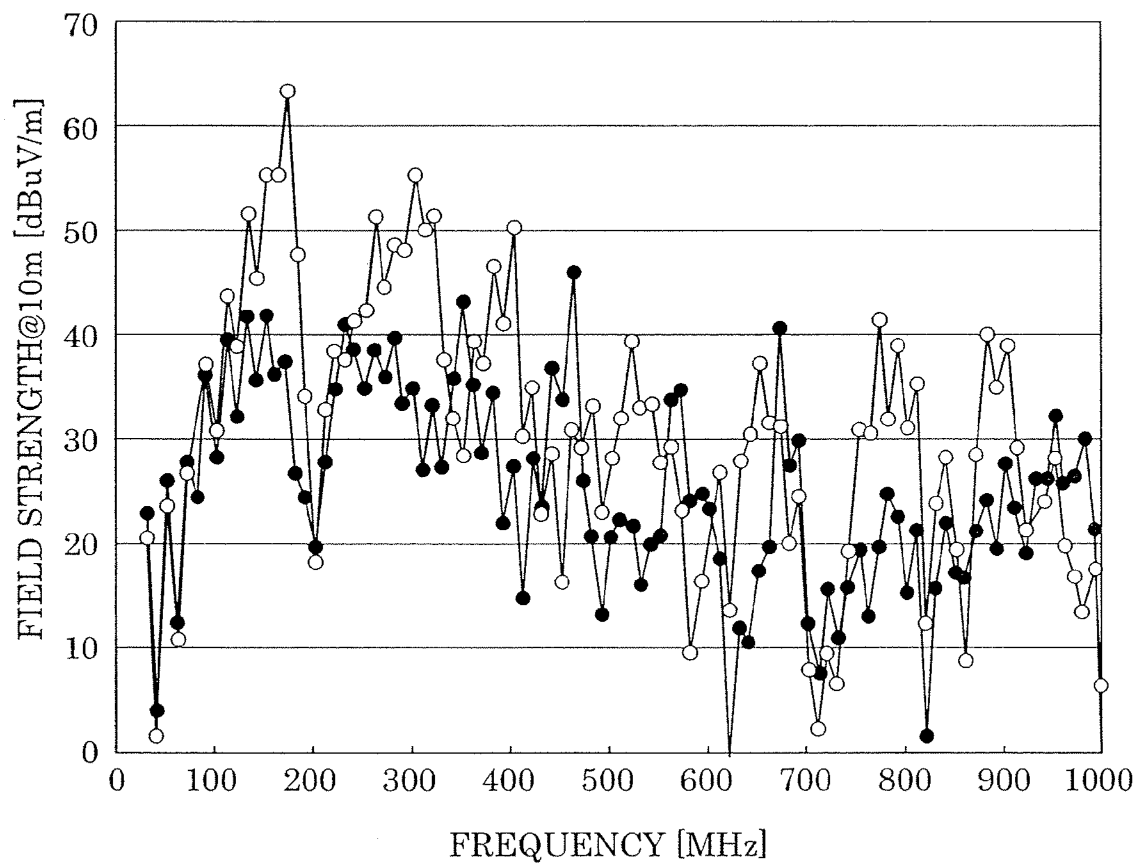
FIG. 9 is a graph showing calculation results of far radiant field strength based on the electromagnetic field simulation models shown in FIGS. 7 and 8.

FIG. 9 shows results of analyses conducted based on the electromagnetic field simulation models shown in FIGS. 7 and 8. In FIG. 9, marks ○ and ● indicate far radiant field strength obtained at various frequencies for the electromagnetic field simulation model shown in FIG. 7, representing the related art, and for the electromagnetic field simulation model shown in FIG. 8, representing the present invention, respectively.

As seen from FIG. 9, the electromagnetic field simulation model shown in FIG. 7 provides larger values of the radiant field strength over the entire frequency range than the electromagnetic field simulation model shown in FIG. 8. Particularly, the radiant field strength shows a difference of 20 db or more near 150 MHz and 300 MHz. In other words, it is understood that the layout of the digital signal cable according to the present invention can greatly suppress the radiant noises.

Reference Example

Figure 10:
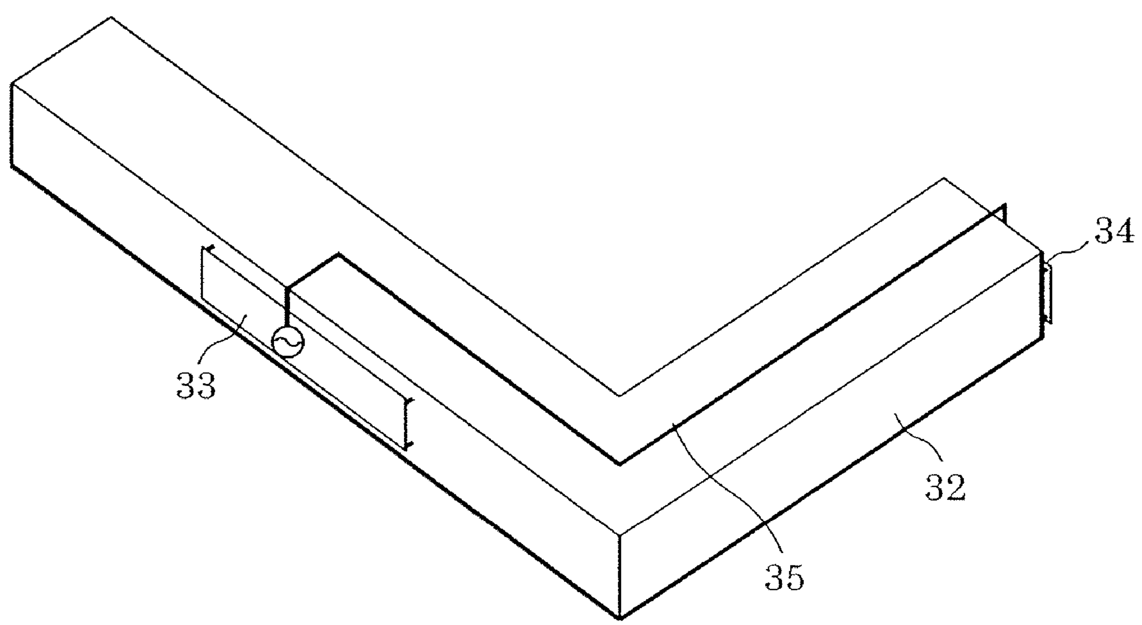
FIG. 10 is a perspective view of an electromagnetic field simulation model for explaining a parallel plate resonance phenomenon in the related art.

For reference, to clarify the influence of the parallel plate resonance, the cable model, shown in FIG. 7, representing the related art was subjected to a comparative analysis between the case of overlaying the reader bottom panel model 31 on the electromagnetic field simulation model and the case of not overlaying the reader bottom panel model 31 on it. FIG. 10 shows an electromagnetic field simulation model when the reader bottom panel model 21 is not overlaid.

Figure 11:
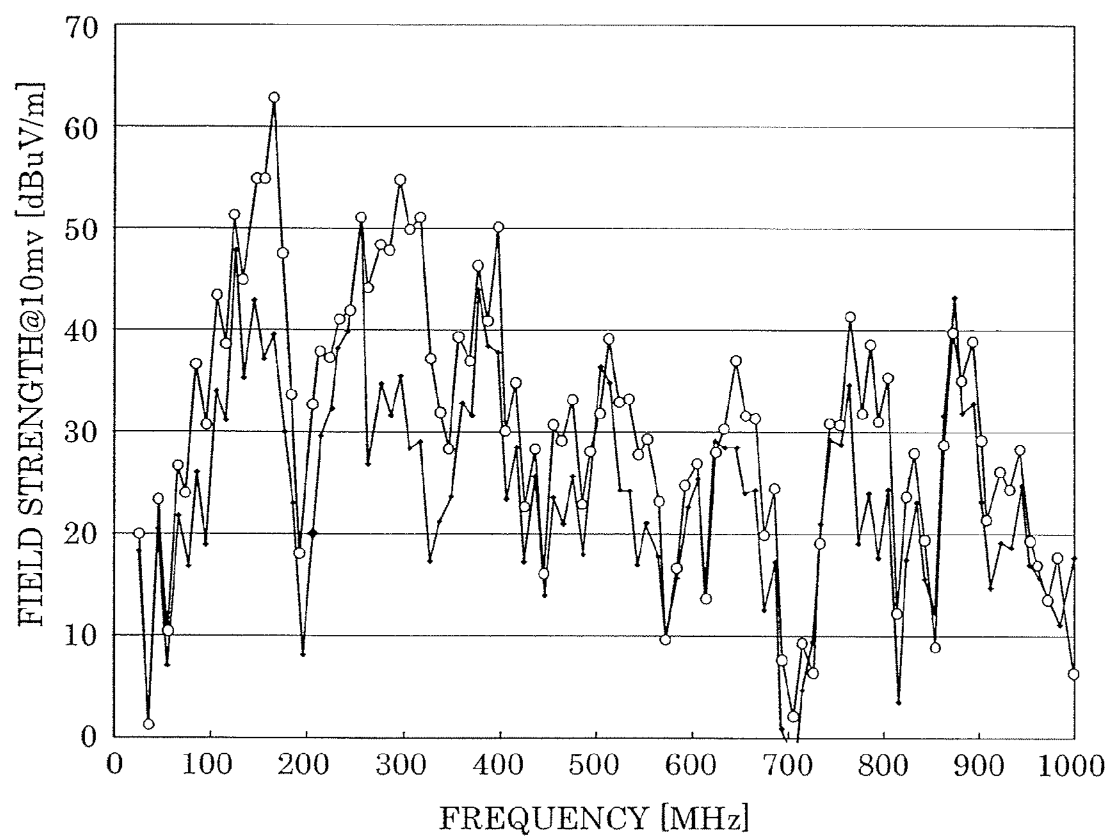
FIG. 11 is a graph showing calculation results of far radiant field strength based on the electromagnetic field simulation models shown in FIGS. 7 and 10.

FIG. 11 shows results of the analyses conducted based on those simulation models. In a graph of FIG. 11, marks ○ and ♦ indicate far radiant field strength obtained at various frequencies, for the case shown in FIG. 7, in which the reader bottom panel model 31 is overlaid, and for the case shown in FIG. 10, in which the reader bottom panel model 31 is not overlaid, respectively.

As seen from FIG. 11, the radiant field strength shows a large difference of 20 db or more near 150 MHz and 300 MHz between the case of the reader bottom panel model 31 being overlaid and the case of the reader bottom panel model 31 being not overlaid. Stated another way, overlaying the reader bottom panel model 31 increases the radiant noises at frequencies near 150 MHz and 300 MHz. To consider such an increase of the radiant noises, FIG. 12 shows a distribution of RF (radio frequency) current flowing through the L-shaped metallic housing model 32 at a frequency of near 150 MHz when the reader bottom panel model 31 is overlaid.

Figure 12:
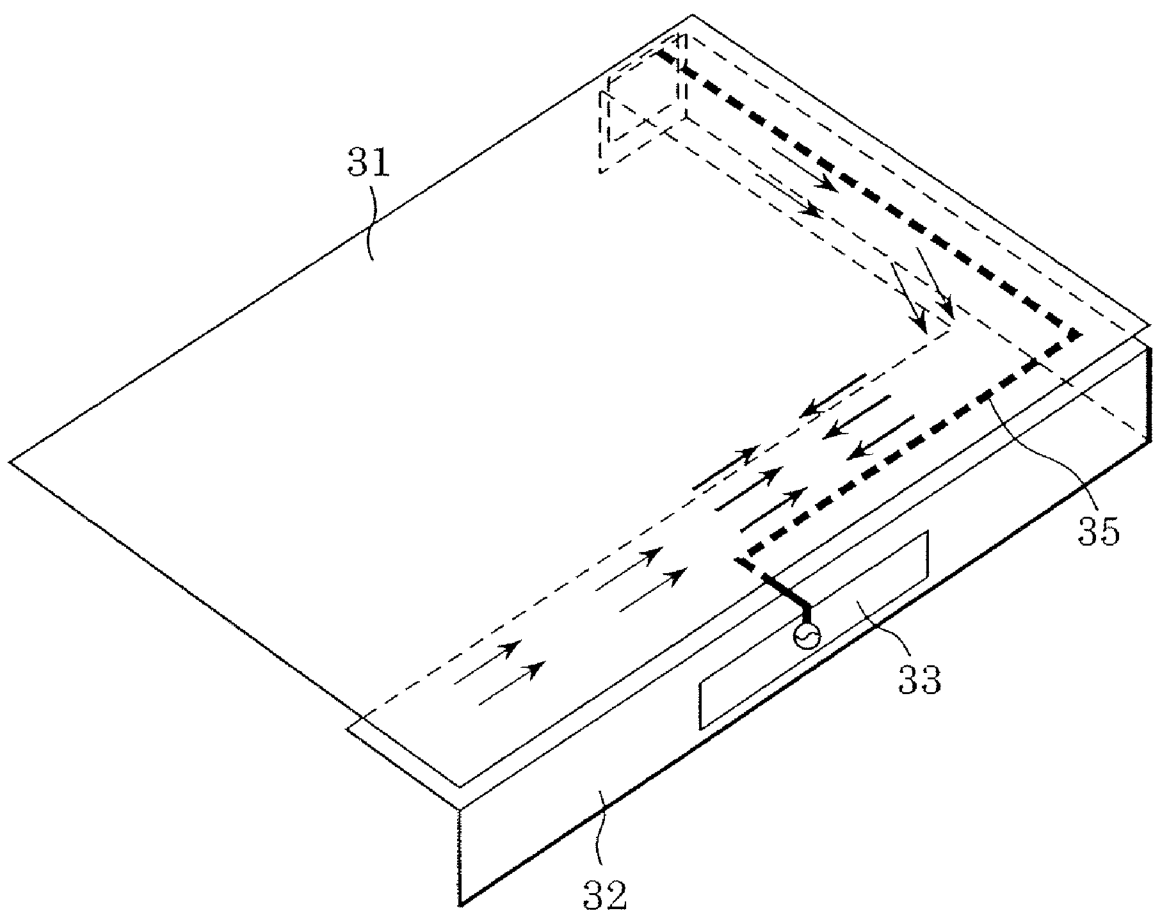
FIG. 12 shows a simulation result representing a distribution of RF (radio frequency) current flowing through a metallic housing, which corresponds to a frequency of about 150 MHz in the calculation results of FIG. 11 based on the electromagnetic field simulation models.

As seen from FIG. 12, standing waves are generated at a span of $\lambda/2$ corresponding to the form of node-loop-node over the coupling surface of the L-shaped metallic housing model 32. In other words, a parallel plate resonance phenomenon occurs between the L-shaped metallic housing model 32 (corresponding to the printer unit) and the reader bottom panel model 31 (corresponding to the reader unit), and a level of radiant noises increases.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2003-430424 filed Dec. 25, 2003, which is hereby incorporated by reference herein.

What is claimed is:

1. A copying machine comprising:

an image printing section having a first metallic housing having an inner surface and an outer surface;

an image reading section having a second metallic housing, in which an upper housing of the first metallic housing and a lower housing of the second metallic house are opposed to each other;

an image controller unit mounted on a rear side of the image printing section;

a console unit mounted on a front side of the image printing section; and a cable connecting the image controller unit and the console unit, and extending along the inner surface of the upper housing of the first metallic housing by penetrating a rear housing of the first metallic housing and drawing out of the first metallic housing, wherein a portion of the cable is in contact with the inner surface of the upper housing of the first metallic housing, and the cable transmits a high-speed signal of at least 100 kHz.

* * * * *